(12) United States Patent
Ishii et al.

(10) Patent No.: US 8,067,743 B2
(45) Date of Patent: Nov. 29, 2011

(54) IMAGING APPARATUS AND RADIATION IMAGING APPARATUS

(75) Inventors: Takamasa Ishii, Honjo (JP); Chiori Mochizuki, Sagamihara (JP); Minoru Watanabe, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 742 days.

(21) Appl. No.: 12/095,674

(22) PCT Filed: Jan. 11, 2007

(86) PCT No.: PCT/JP2007/050629
§ 371 (c)(1),
(2), (4) Date: May 30, 2008

(87) PCT Pub. No.: WO2007/086292
PCT Pub. Date: Aug. 2, 2007

(65) Prior Publication Data
US 2010/0277630 A1    Nov. 4, 2010

(30) Foreign Application Priority Data
Jan. 27, 2006   (JP) .................................. 2006-019032

(51) Int. Cl.
*G01T 1/24*   (2006.01)
(52) U.S. Cl. ......... 250/370.09; 250/370.11; 250/370.08
(58) Field of Classification Search ............. 250/370.09, 250/370.11, 370.08
See application file for complete search history.

(56) References Cited

U.S. PATENT DOCUMENTS

| | | | |
|---|---|---|---|
| 6,353,228 B1 * | 3/2002 | Itabashi | 250/370.11 |
| 6,515,286 B2 * | 2/2003 | Kuwabara | 250/370.11 |
| 7,205,547 B2 | 4/2007 | Ishii et al. | 250/370.09 |
| 7,205,568 B2 | 4/2007 | Watanabe et al. | 257/59 |
| 7,214,945 B2 * | 5/2007 | Nomura et al. | 250/370.08 |
| 7,231,018 B2 * | 6/2007 | Morii et al. | 378/97 |
| 7,381,965 B2 | 6/2008 | Ishii et al. | 250/370.11 |
| 2004/0145800 A1 | 7/2004 | Devaux et al. | |
| 2004/0159794 A1 | 8/2004 | Morii et al. | |
| 2005/0145800 A1 * | 7/2005 | Mochizuki | 250/370.09 |
| 2006/0062352 A1 | 3/2006 | Nomura et al. | 378/98.8 |

(Continued)

FOREIGN PATENT DOCUMENTS
EP    1 420 453 A2    5/2004

(Continued)

OTHER PUBLICATIONS

Int'l Search Report mailed Apr. 24, 2007, for International Application No. PCT/JP2007/050629.

(Continued)

*Primary Examiner* — David Porta
*Assistant Examiner* — Djura Malevic
(74) *Attorney, Agent, or Firm* — Fitzpatrick, Cella, Harper & Scinto

(57) ABSTRACT

Pixels including a photoelectric conversion element 1, a signal transfer TFT (thin film transistor) 2 electrically connected to the photoelectric conversion element, and a reset TFT 3 electrically connected to the photoelectric conversion element and for applying a bias to the photoelectric conversion element are two-dimensionally disposed on the insulating substrate, and the photoelectric conversion element 1, signal transfer TFT 2, and reset TFT 3 are electrically connected through a common contact hole 9. A source or drain electrode of the signal transfer TFT 2 and the source or drain electrode of the reset TFT 3 are formed from a common electroconductive layer.

17 Claims, 12 Drawing Sheets

U.S. PATENT DOCUMENTS

| | | | |
|---|---|---|---|
| 2006/0065944 A1 | 3/2006 | Mochizuki et al. | 257/444 |
| 2006/0249763 A1 | 11/2006 | Mochizuki et al. | 257/291 |
| 2007/0045556 A1 | 3/2007 | Watanabe et al. | 250/370.14 |
| 2007/0069107 A1 | 3/2007 | Ishii et al. | 250/208.1 |
| 2007/0146520 A1 | 6/2007 | Watanabe et al. | 348/308 |
| 2007/0272870 A1 | 11/2007 | Ishii et al. | 250/370.08 |
| 2008/0099688 A1 | 5/2008 | Ishii et al. | 250/370.08 |

FOREIGN PATENT DOCUMENTS

| | | |
|---|---|---|
| JP | 2003-218339 A1 | 7/2003 |
| JP | 2004-179645 A1 | 6/2004 |

OTHER PUBLICATIONS

PCT Written Opinion of the International Searching Authority mailed Apr. 24, 2007, for International Application No. PCT/JP2007/050629.

PCT Written Opinion of the International Preliminary Examining Authority (PCT/IPEA/408) mailed Feb. 26, 2008, for International Application No. PCT/JP2007/050629.

Office Action dated Mar. 4, 2011, issued by the Japanese Patent Office in counterpart Japanese application 2006-019032 (with translation).

* cited by examiner

US 8,067,743 B2

IMAGING APPARATUS AND RADIATION IMAGING APPARATUS

This Application is a National Stage filing under 35 U.S.C. §371 of International Application No. PCT/JP2007/050629, filed Jan. 11, 2007.

TECHNICAL FIELD

The present invention relates to an optical imaging apparatus and a radiation imaging apparatus applied to an analyzing instrument and the like that are suitable for use as a medical diagnostic imaging apparatus, a non-destructive inspection apparatus, and the like. Incidentally, in the present specification, the term "radiation" is intended to include not only electromagnetic radiation such as X-rays and γ-rays but also to beams of corpuscular bodies such as α-rays and β-rays. Further, the term "conversion element" refers to a semiconductor element that converts at least a light signal or radiation into an electrical signal.

BACKGROUND ART

In recent years, manufacturing technology of liquid crystal display panels using thin film transistors (TFT) has been advancing, and upsizing of the panel and the display unit screen is going on. This manufacturing technology is applied to a large-area sensor having a conversion element (photoelectric conversion element) including a semiconductor and a switching element such as the TFT. Such an area sensor (radiation imaging sensor panel) is combined with a scintillator that converts radiation into light, e.g., visible light, and is used in the field of radiation imaging apparatus such as a medical X-ray imaging apparatus.

Heretofore, an imaging method used by medical image diagnosis has been roughly classified into plain radiography for obtaining a still image and fluoroscopic radiography for obtaining a moving image. However, for the moment, the above-described radiation imaging apparatus begins to be used mainly for plain radiography. At the same time, the situation is such that the reading speed is not sufficient for fluoroscopic radiography.

Hence, in U.S. Patent Application Publication 2005/145800 (Japanese Patent Application Laid-Open No. 2003-218339), one pixel of the area sensor includes the conversion element, a transfer switch (transfer TFT and the like) for transferring a signal from the conversion element, and a reset switch (reset TFT) for resetting the conversion element. This configuration provides a radiation imaging apparatus having a faster reading speed.

In general, the structure of the pixel of the area sensor (radiation imaging sensor panel) is roughly classified into two types, a flat type, which has the conversion element and the switching element on the same flat surface, and a lamination type, which has the conversion element over the upper side of the switching element. The former can simplify the manufacturing process since the conversion element and the switching element can be formed by the same semiconductor manufacturing process. The latter type can form the area of the conversion element larger in one pixel as compared to the flat type since the conversion element is disposed over the switching element. Therefore, an aperture ratio of the pixel can be made large, so that the pixel becomes highly sensitive. For this reason, in Patent Document 1, the lamination type sensor is also described.

FIG. 11 is a plan view of the radiation imaging apparatus using a conventional lamination type structure. Although in fact a scintillator is disposed over the pixel of the radiation imaging apparatus, it is omitted from FIG. 11.

The conventional radiation imaging apparatus includes, within one pixel as shown in FIG. 11, a conversion element (photoelectric conversion element) 101, a transfer switch (transfer TFT) 102, and a reset switch (reset TFT) 103.

An under-electrode of the conversion element and a source or drain electrode of the transfer switch are connected through a contact hole. Similarly, the under-electrode of the conversion element and the source or drain electrode of the reset switch are also connected through a contact hole. Hence, a contact hole is provided for each switching element.

DISCLOSURE OF THE INVENTION

In U.S. Patent Application Publication 2005/145800 (Japanese Patent Application Laid-Open No. 2003-218339), as shown in FIG. 11, the transfer switch 102 and the reset switch 103 are independently disposed, and the photoelectric conversion element including the conversion element 101 and a contact hole 109 for connecting the switching element are independently provided within one pixel. Hence, for example, even when a connection failure occurs in the contact hole 109 of the reset switch 103 in a certain pixel, if the transfer switch 102 is normal, a signal of some kind from the conversion element can be read, and therefore, there are often cases where it is difficult to identify a defective pixel in a defect inspection process.

Further, although the size of the contact hole is usually about 10 µm to 20 µm, for example, when pixel pitches d1 and d2 are larger, e.g., 200 µm, as shown in FIG. 11, the mentioned size of this contact hole does not cause any major problem, and each switching element can be freely disposed.

In contrast to this, when a high-definition image is required, e.g., for a mammogram, the image pitch becomes smaller, but pixel pitches d3 and d4 of about 100 µm are the limit in which two switching elements can be disposed within one pixel, as shown in FIG. 12. Further, when the pixel pitches d3 and d4 are made smaller, for example about 80 µm and 50 µm, there is a possibility that the contact hole 109 ends up being superposed on the wiring, e.g., the gate wiring 105 and the signal wiring 106.

When a fluctuation occurs in film thickness of an interlayer insulating layer within a radiation imaging sensor panel, the size of the contact hole 109 fluctuates. As a result, a parasitic capacitance between each wiring and the conversion element 101 fluctuates within the radio imaging sensor panel, and this causes a fluctuation in sensitivity. To prevent this fluctuation, for example, when the gate wiring 105 is made thin, the resistance of the gate wiring 105 is made larger. Hence, a gate driving pulse applied to the gate wiring 105 becomes smaller. Therefore, to obtain the transfer of sufficient signals using the transfer switch 102, the electricity conduction time of the transfer switch 102 is increased, and the reading speed is reduced. Further, for example, when the signal wiring 106 is made thin, the resistance of the signal wiring 106 becomes larger, and this increases noise, so that the S/N, that is, sensitivity, ends up being reduced. Thus, in either case, deterioration of characteristics is likely to be caused.

From the above, it will be clear that an object of the present invention is to prevent deterioration of characteristics in the imaging apparatus and radiation imaging apparatus having small pixel pitches and capable of easily identifying a defective pixel in the defect inspection process.

As means for solving the above-described problems, the present inventors provide a photoelectric conversion apparatus in which pixels including a conversion element that converts at least an optical signal into an electric signal, a signal transfer switch that is electrically connected to the conversion element, and a reset switch that is electrically connected to the conversion element and applies a bias to the conversion element are two-dimensionally disposed on an insulating substrate, and in which the conversion element, the signal transfer switch, and the reset switch are electrically connected through a common contact hole.

A scintillator converting, into light, radiation of corpuscular rays such as X-rays, γ-rays or α-rays and β-rays may be disposed over the above described conversion element, to constitute a radiation imaging apparatus.

Further, the present inventors provide a radiation imaging apparatus in which pixels including a conversion element that converts at least radiation into an electric signal, a signal transfer switch that is electrically connected to the conversion element, and a reset switch that is electrically connected to the conversion element and applies a bias to the conversion element are two-dimensionally disposed on an insulating substrate, and in which the conversion element, the signal transfer switch, and the reset switch are electrically connected through a common contact hole.

According to the present invention, it is easy to identify defective pixels in a defect inspection process. Further, it is possible to prevent deterioration of the characteristics of the apparatus even in imaging apparatus and radiation imaging apparatus having small pixel pitches.

Other features and advantages of the present invention will be apparent from the following description taken in conjunction with the accompanying drawings, in which like reference characters designate the same or similar parts throughout the Figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

Hereinafter, the best mode to execute the present invention will be described in detail with reference to the drawings. In the following description, a radiation imaging apparatus will be taken up. The radiation imaging apparatus using a scintillator and a photoelectric conversion element is disposed with a scintillator that converts corpuscular rays such as X-rays, γ-rays or α-rays and β-rays into visible light, and this imaging apparatus is the best mode of the imaging apparatus of the present invention. In the following description, an example of a radiation detector that detects X-rays will be addressed. Further, the present invention is also suitably applied to an imaging apparatus that detects infra-red rays.

First Embodiment

Figure 1:
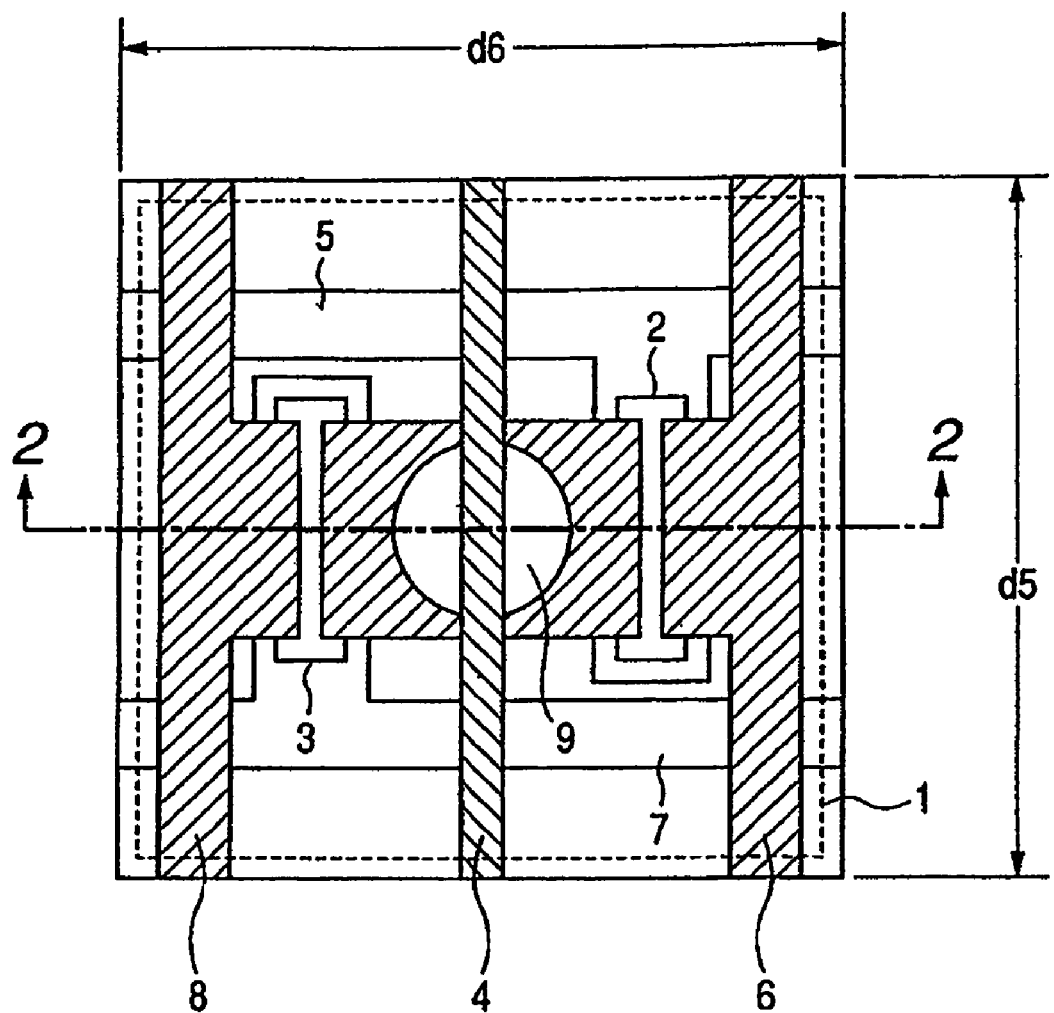
FIG. 1 is a top plan view to explain a radiation imaging apparatus which is a first embodiment of the present invention.
Figure 2:
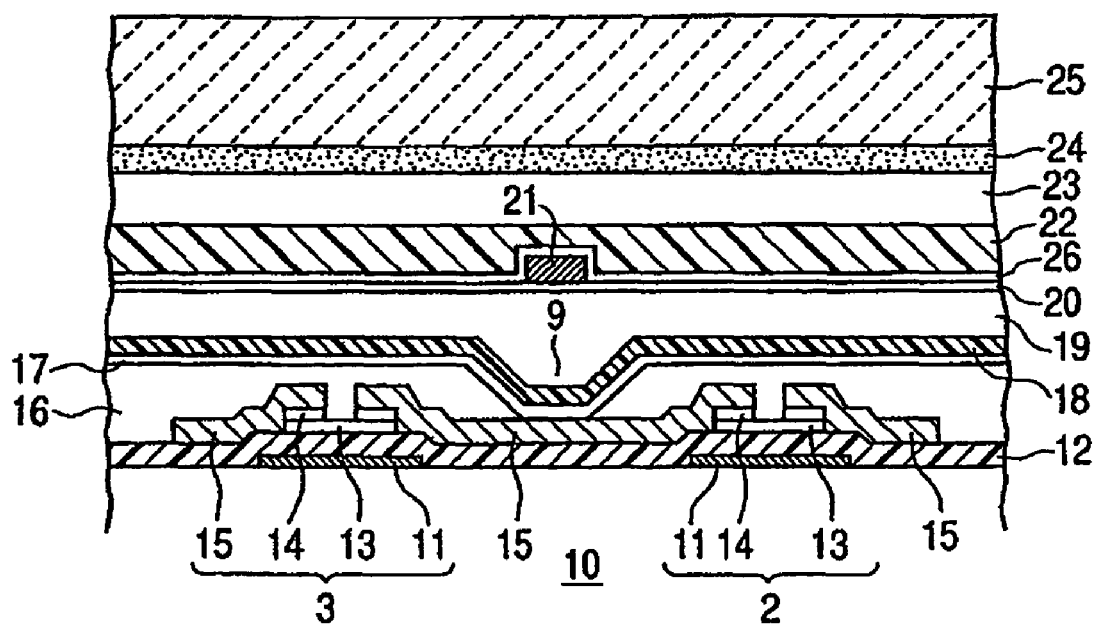
FIG. 2 is a sectional view cut along the line 2-2 in FIG. 1 to explain the radiation imaging apparatus which is the first embodiment of the present invention.

An radiation imaging apparatus according to a first embodiment of the present invention will be described with reference to the drawings. FIG. 1 is a top plan view of one pixel of the radiation imaging apparatus of the present invention, and FIG. 2 is a sectional view cut along the line 2-2 in FIG. 1.

The radiation imaging apparatus in the present embodiment includes a lamination-type radiation imaging sensor panel forming a MIS-type photoelectric conversion element that includes a conversion element on the upper part of a transfer switch (transfer TFT) and a reset switch (reset TFT). Further, this apparatus is an indirect-type radiation imaging apparatus including a scintillator for converting the X-rays into light, e.g., visible light, located over these switches.

A configuration of the radiation detector of the present embodiment will be described with reference to FIGS. 1 and 2.

In FIG. 1, reference numeral 1 denotes a conversion element such as a photoelectric conversion element that converts light such as incident visible light into an electric charge. Reference numeral 2 denotes a transfer switch for transferring the electric charge produced by the conversion element 1. Reference numeral 3 denotes a reset switch for resetting the conversion element 1. Over the conversion element 1, a scintillator that converts unillustrated incident X-rays into light, e.g., visible light, is disposed. Here, the transfer switch is a transfer TFT, and the reset switch is a rest TFT. Reference numeral 4 denotes a bias wiring for applying a bias to the conversion element 1, and reference numeral 5 denotes a gate wiring for giving a gate drive pulse from a drive device (not shown) to the transfer switch 2. Reference numeral 6 denotes a signal wiring for transferring the electric charge transferred by the transfer switch 2 to a reading device (not shown). Reference numeral 7 denotes a gate wiring for giving the gate drive pulse from a drive device (not shown) to the reset switch 3, and reference numeral 8 denotes a reset wiring for giving a bias for resetting the conversion element 1. Reference numeral 9 denotes a contact hole that electrically connects the source or drain electrode of the conversion element 1 and the transfer switch 2 or the source or the drain electrode of the reset switch 3.

As shown in FIG. 2, the transfer switch 2 and the reset switch 3 include a first electroconductive layer 11, a first insulating layer 12, a first semiconductor layer 13, a first impurity semiconductor layer 14, and a second electroconductive layer 15, which are all formed on an insulating substrate 10, respectively. Here, the first electroconductive layer 11 is used as gate electrodes and gate wirings 5 and 7 of the transfer switch 2 and the reset switch 3, and the first insulating layer 12 is used as a gate insulating film. Further, the first semiconductor layer 13 is used as a channel of the transfer switch 2 and the reset switch 3, and the first impurity semiconductor 14 is used as an ohmic contact layer. Further, the second electroconductive layer 15 is used as a source or drain electrode of the transfer switch 2 and the reset switch 3, the signal wiring 6, and the reset wiring 8. Over that layer, an interlayer insulating layer 16 is provided, and further over that interlayer insulating layer 16, a MIS-type photoelectric conversion element including the conversion element 1 is laminated. The MIS-type photoelectric conversion element including the conversion element 1 is fabricated from a third electroconductive layer 17, a second insulating layer 18, a second semiconductor layer 19, a second impurity conductor layer 20, a fourth electroconductive layer 21, and a fifth electroconductive layer 26. Here, the third electroconductive layer 17 is used as an under-electrode of the MIS-type photoelectric conversion element, and the second insulating layer 18 is used as an insulating layer of the MIS-type photoelectric conversion element. Further, the second semiconductor layer 19 is used as a photoelectric conversion layer of the MIS-type photoelectric conversion element, and the second impurity semiconductor layer 20 is used as an ohmic contact layer having a hole blocking effect of the MIS-type photoelectric conversion element and an upper-electrode. Further, the fourth electroconductive layer 21 is used as a bias wiring 4 of the MIS-type photoelectric conversion element, and the fifth electroconductive layer 26 is used as the upper electrode of the MIS-type photoelectric conversion element. Further, over that layer, a third insulating layer (protective layer) 22, a passivation layer 23, an adhesive layer 24, and a scintillator 25 such as CsI that converts the X-rays into light, e.g., visible light, are formed. The scintillator 25 is provided on a carbon plate or a film (not shown), which is glued to the radiation imaging sensor panel by means of the adhesive layer 24.

One of the source and drain electrodes of the transfer switch 2 and one of the source and drain electrodes of the reset switch 3 include a common second electroconductive layer 15, and the second electroconductive layer 15 is a common electrode. However, it is conceivable that the common second electroconductive layer 15 may include a wiring that connects together one of the source and drain electrodes of the transfer switch 2, one of the source and drain electrodes of the reset switch 3, and one of the electrodes of the transfer switch 2 and the reset switch 3. In that case, a part of the common second electroconductive layer 15 includes one of the source and drain electrodes of the transfer switch and one of the source and drain electrodes of the reset switch 3.

Here, in the present embodiment, the third electroconductive layer 17 which is the under-electrode of the photoelectric conversion element and one of the source and drain electrodes (second electroconductive layer 15) of the transfer switch 2 are connected by the contact hole 9. Further, the under-electrode (third electroconductive layer 17) of the photoelectric conversion element and one of the source and drain electrodes (second electroconductive layer 15) of the reset switch 3 are connected by the contact hole 9. That is, by the one common contact hole 9, the conversion element 1, which effects photoelectric conversion, the transfer switch 2, and the reset switch 3 are connected.

Hence, when a connection failure occurs in the contact hole 9, the signal of the photoelectric conversion element is not read, and therefore, it is easy to identify that the pixel is a defective pixel in the defect inspection process.

Further, though the pixel pitches d5 and d6 of the radiation imaging apparatus of the present embodiment are 80 μm each, even when the diameter of the contact hole 9 is made 20 μm in order to realize the lamination type of structure by disposing the photoelectrical conversion element through the interlayer insulating layer, there is room for two switching elements to be disposed. That is, in the present embodiment, since only one contact hole exists within one pixel, two TFTs can be disposed within one pixel without making the wire width of the gate wires 5 and 7 and the signal wire 6 thin. That is, the contact hole 9 for connecting to the photoelectrical conversion element is used in common for two switching elements, so that a ratio of area occupying the contact hole within one pixel is reduced, and space for dispose two switching elements can be easily secured even in the pixel of small pitch.

From the above, the radiation imaging apparatus of the present embodiment permits easy identification of a defective pixel in the defect pixel inspection process, and can prevent deterioration of the apparatus characteristics even in the case of the radiation imaging apparatus having small pixel pitches.

Incidentally, though one pixel only is shown in FIG. 1, in reality, for example, 2000×2000 pixels are disposed on the insulating substrate 10, and configures the photoelectric imaging sensor panel. Further, in the present embodiment, the indirect radiation imaging apparatus combining the photoelectric conversion element and scintillator has been shown. However, in place of the photoelectric conversion element, the same effect can be obtained in the direct-type radiation imaging apparatus using the conversion element (hereinafter, referred to as direct-conversion-type element) sandwiching a semiconductor layer such as amorphous selenium that directly converts corpuscular rays such as X-rays, γ-rays or α-rays and β-rays into electrical charge between the electrodes. Further, the conversion element of the indirect-type radiation imaging apparatus may use another type of photoelectric conversion element, of the MIS-type photoelectric conversion element, for example, a PIN-type photoelectric conversion element. Further, with respect to the structure of the pixel of the indirect radiation imaging apparatus, a flat type in which the photoelectric conversion element and switching element are included in the same layer or a lamination type in which the photoelectric conversion element is formed over the switching element may be provided. Furthermore, in the present embodiment, though an example has been shown in which the carbon plate and the film are provided with the scintillator layer such as CsI so as to be glued together to the radiation imaging sensor panel through the adhesive layer 24, the scintillator material such as CsI may be laminated directly over the passivation layer 23.

Second Embodiment

Figure 3:
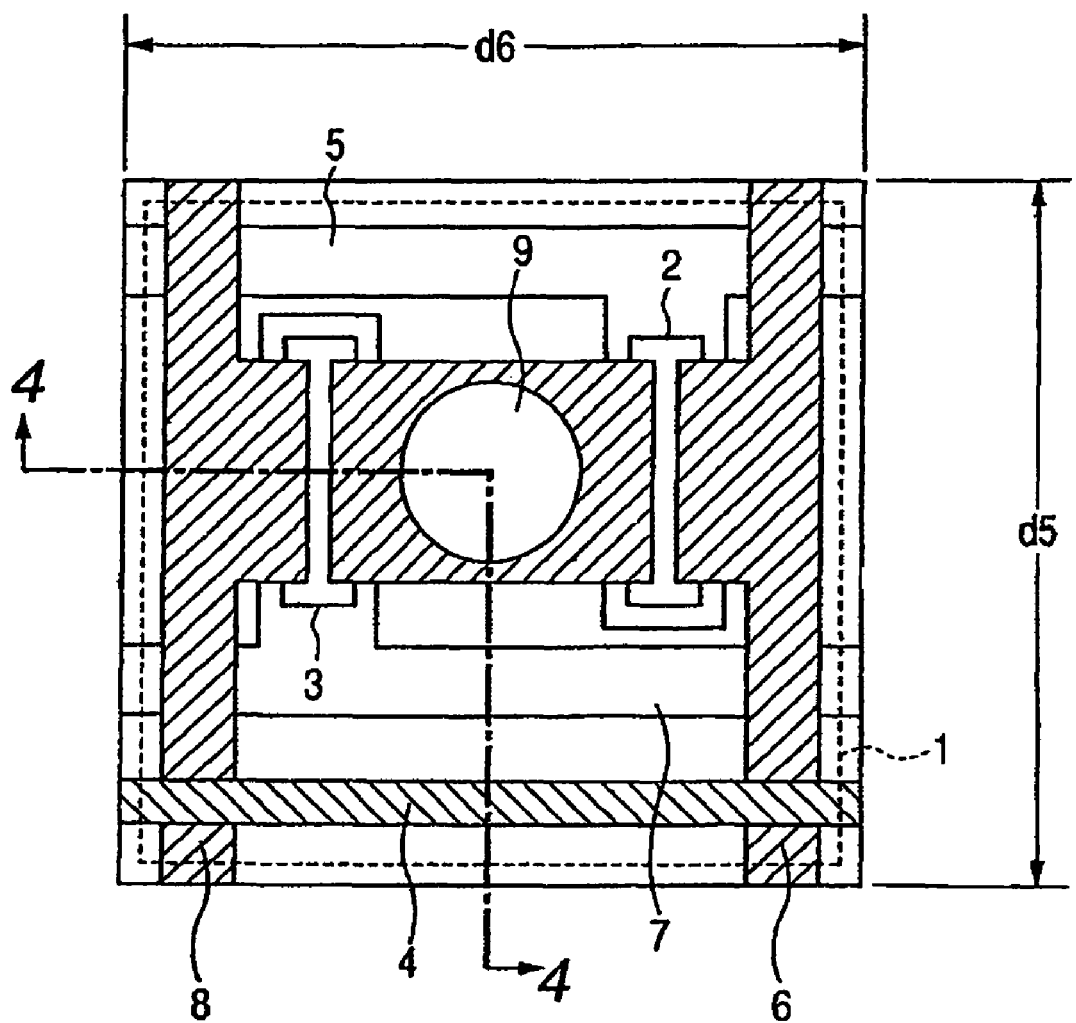
FIG. 3 is a top plan view to explain the radiation imaging apparatus which is a second embodiment of the present invention.
Figure 4:
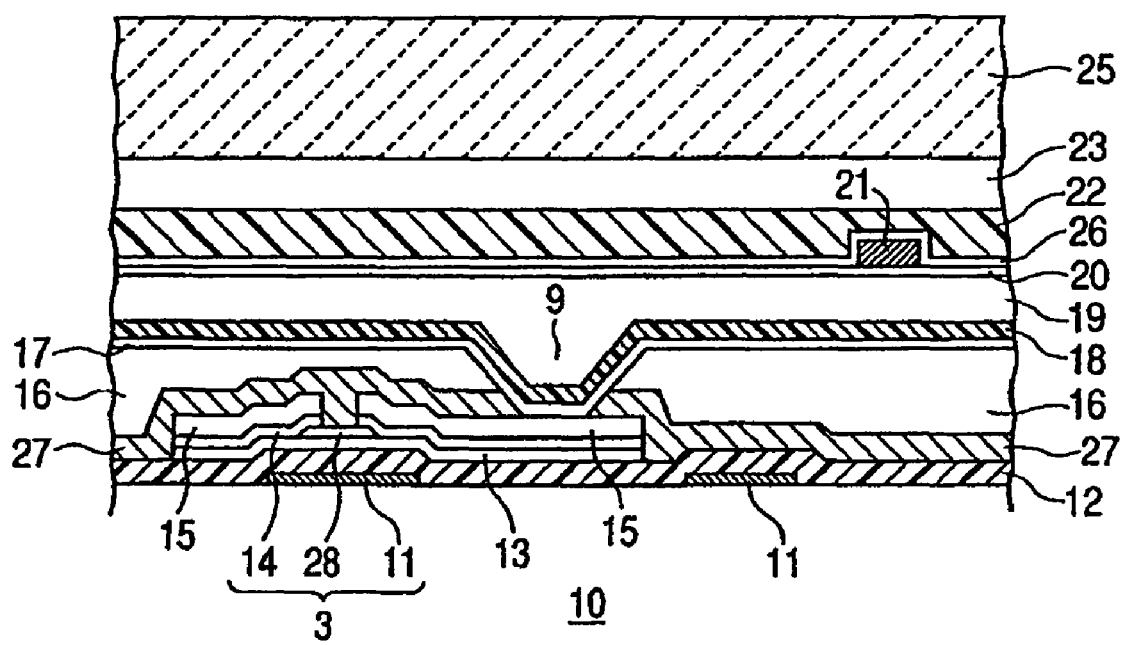
FIG. 4 is a sectional view cut along the line 4-4 in FIG. 3 to explain the radiation imaging apparatus which is a third embodiment of the present invention.

Hereinafter, a radiation imaging apparatus according to a second embodiment of the present invention will be described with reference to the drawings. FIG. 3 is a top plan view of one pixel of the radiation imaging apparatus of the present embodiment, and FIG. 4 is a sectional view cut along the line 4-4 in FIG. 3.

Figure 11:
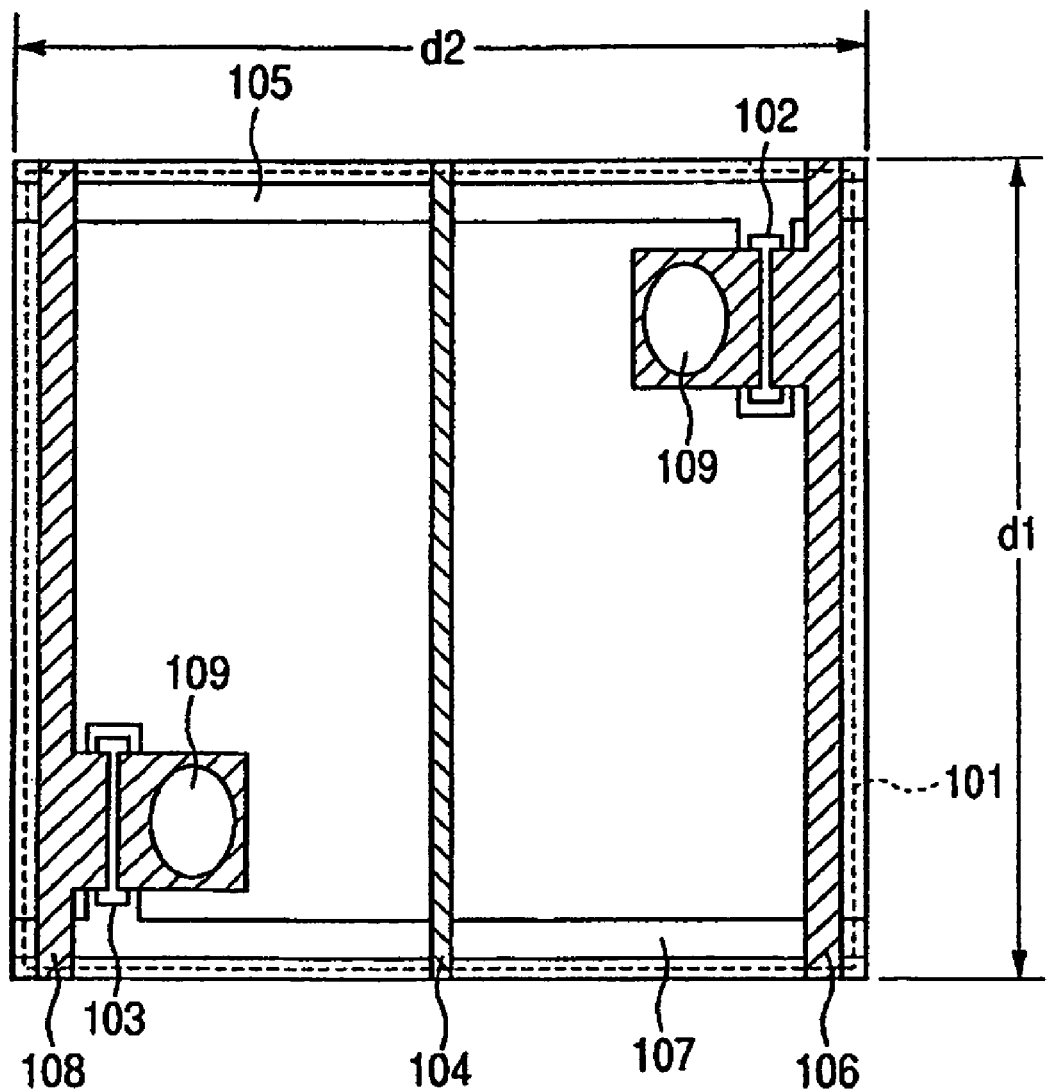
FIG. 11 is a top plan view to explain a conventional radiation imaging apparatus.
Figure 12:
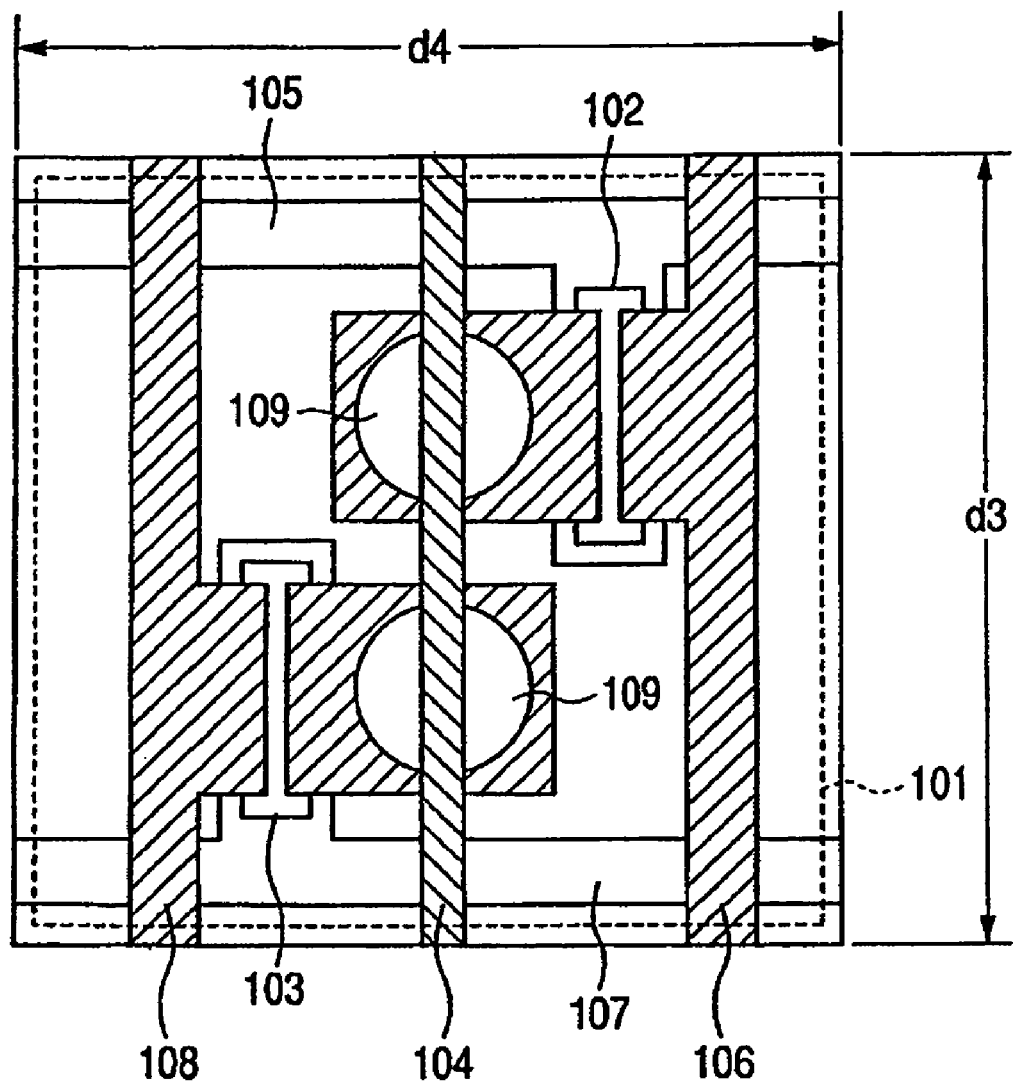
FIG. 12 is a top plan view to explain a problem of a conventional radiation imaging apparatus.

The radiation imaging apparatus in the present embodiment has a lamination type radiation imaging apparatus substrate disposed with a MIS-type photoelectric conversion element including a conversion element on the upper part of a transfer switch (transfer TFT) and a reset switch (reset TFT). Further, located over the lamination-type radiation imaging apparatus substrate, it is an indirect radiation imaging apparatus having a scintillator for converting X-rays into light, e.g., visible light. An equivalent circuit diagram of the radiation imaging apparatus of the present embodiment is the same as for the conventional structure described above, and its operation principle is the same as the conventional radiation imaging apparatus described by using FIGS. 11 and 12, and therefore, the description thereof will be omitted here.

The configuration of the radiation imaging apparatus of the present embodiment will be described by using FIGS. 3 and 4.

In FIG. 3, reference numeral 1 denotes a conversion element such as photoelectric conversion element that converts a light such as an incident visible light into an electric charge. Reference numeral 2 denotes a transfer switch for transferring the electric charge converted by the conversion element 1. Reference numeral 3 denotes a reset switch for resetting the conversion element 1. Over the conversion element 1, a scintillator that converts unillustrated incident X-rays into light, e.g., visible light, is disposed. Here, the transfer switch is a transfer TFT, and the reset switch is a reset TFT. Reference numeral 4 denotes a bias wiring for applying a bias to the conversion element 1, and reference numeral 5 denotes a gate wiring for giving a gate drive pulse from a drive device (not shown) to the transfer switch 2. Reference numeral 6 denotes a signal wiring for transmitting the electric charge transferred by the transfer switch 2 to a reading device (not shown). Reference numeral 7 denotes a gate wiring for giving the gate drive pulse from a drive device (not shown) to the reset switch 3, and reference numeral 8 denotes a reset wiring for giving a bias for resetting the conversion element 1. Reference numeral 9 denotes a contact hole that electrically connects the source or drain electrode of the conversion element 1 and the transfer switch 2 and the source or the drain electrode of the reset switch 3.

As shown in FIG. 4, the transfer switch 2 and the reset switch 3 include a first electroconductive layer 11, a first insulating layer 12, a first semiconductor layer 13, a fourth insulating layer 28, a first impurity semiconductor layer 14, and a second electroconductive layer 15, which are all formed on an insulating substrate 10. Here, the first electroconductive layer 11 is used as gate electrodes and gate wirings 5 and 7 of the transfer switch 2 and the reset switch 3, and the first insulating layer 12 is used as a gate insulating film. Further, the first semiconductor layer 13 is used as a channel of the transfer switch 2 and the reset switch 3, and the first impurity semiconductor layer 14 is used as an ohmic contact layer. Further, the second electroconductive layer 15 is used as source or drain electrode of the transfer switch 2 and the reset switch 3, the signal wiring 6, and the reset wiring 8. Over that layer, a fifth insulating layer (protective layer) 27 and an interlayer insulating layer 16 are provided, and further over that interlayer insulating layer 16, a MIS-type photoelectric conversion element including the conversion element 1 is laminated. The MIS-type photoelectric conversion element including the conversion element 1 is fabricated from a third electroconductive layer 17, a second insulating layer 18, a second semiconductor layer 19, a second impurity semiconductor layer 20, a fourth electroconductive layer 21, and a fifth electroconductive layer 26. Here, the third electroconductive layer 17 is used as an under-electrode of the MIS-type photoelectric conversion element, and the second insulating layer 18 is used as an insulating layer of the MIS-type photoelectric conversion element. Further, the second semiconductor layer 19 is used as a photoelectric conversion layer of the MIS-type photoelectric conversion element, and the second impurity semiconductor layer 20 is used as an ohmic contact layer having a hole blocking effect of the MIS-type photoelectric conversion element. Further, the fourth electroconductive layer 21 is used as an upper electrode or a bias wiring 4 of the MIS-type photoelectric conversion element, and the fifth electroconductive layer 26 is used as the upper electrode of the MIS-type photoelectric conversion element. Further, over that layer, a third insulating layer 22, a passivation layer 23, and a scintillator layer 25 such as CsI that converts the X-rays into light, e.g., visible light, are formed. The scintillator layer 25 is directly laminated and formed over the passivation layer 23.

One of the source and drain electrodes of the transfer switch 2, and one of the source and drain electrodes of the reset switch 3 include the common second electroconductive layer 15, and the second electroconductive layer 15 is thus a common electrode. However, it is conceivable that the common second electroconductive layer 15 may include a wiring that connects together one of the source and drain electrodes of the transfer switch 2, one of the source and drain electrodes of the reset switch 3, and one of the electrodes of the transfer switch 2 and the reset switch 3. In that case, a part of the common second electroconductive layer 15 includes one of the source and drain electrodes of the transfer switch 2 and one of the source and drain electrodes of the reset switch 3.

Here, in the present embodiment, the third electroconductive layer 17 which is the under-electrode of the photoelectric conversion element and one of the source and drain electrodes (second electroconductive layer 15) of the transfer switch 2 are connected by the contact hole 9. Further, the under-electrode (third electroconductive layer 17) of the photoelectric conversion element and one of the source and drain electrodes (second electroconductive layer 15) of the reset switch 3 are connected by the contact hole 9. That is, by the one common contact hole 9, the conversion element 1 which becomes the photoelectric conversion element, the transfer switch 2, and the reset switch 3 are connected.

Hence, when a connection failure occurs in the contact hole 9, the signal of the photoelectric conversion element cannot be read, and therefore, it is easy to identify the pixel as a defective pixel in the defect inspection process.

Further, though the pixel pitches d5 and d6 of the radiation imaging apparatus of the present embodiment are 80 μm each, even when the size of the contact hole 9 is made 20 μm in order to realize the lamination-type structure by disposing the photoelectric conversion element through the interlayer insulating layer, two switching elements can be disposed. That is, in the present embodiment, since only one contact hole exists within one pixel, two TFTs can be disposed within one pixel without making the wire width of the gate wires 5 and 7 and the signal wire 6 thin. That is, the contact hole for connecting to the photoelectric conversion element is used in common for two switching elements, so that the ratio of the area occupied by the contact hole within one pixel is reduced, and the area required for two switching elements can be easily found even in the pixel of small pitch.

Further, unlike the first embodiment, the bias wiring 4 is not allowed to be disposed over the contact hole 9. As a result, even when the contact hole 9 is deep, patterning of the bias wiring 4 is possible in a region where the resist film thickness is uniform, and therefore, greater stability in the process can be realized. Here, while a disposing direction of the bias wiring 4 is parallel to the gate wirings 5 and 7, if the bias wiring 4 is disposed on a position where it is not disposed over the contact hole 9, it may be disposed parallel to the signal wiring 6.

From the above, the radiation imaging apparatus of the present embodiment permits easy identification of a defective pixel in the defect pixel inspection process, and can prevent deterioration of the apparatus characteristics even in the case of the radiation imaging apparatus having small pixel pitches.

Incidentally, though one pixel only is shown in FIG. 3, in reality, for example, 2000×2000 pixels are disposed on the insulating substrate 10, and configures the photoelectric imaging sensor panel. Further, in the present embodiment, the indirect radiation imaging apparatus combining the conversion element with the photoelectric conversion element and scintillator has been shown. However, in place of the photoelectric conversion element, the same effect can be obtained in the direct-type radiation imaging apparatus using the conversion element sandwiching the semiconductor layer such as amorphous selenium that directly converts corpuscular rays such as X-rays, γ-rays or α-rays and β-rays into electrical charge between the electrodes. Further, the conversion element of the indirect-type radiation imaging apparatus may use another type of photoelectric conversion element of the MIS-type photoelectric conversion element, for example, a PIN-type photoelectric conversion element. Further, with respect to the structure of the pixel of the indirect radiation imaging apparatus, a flat type in which the semiconductor conversion element and switching element are included in the same layer or a lamination type in which the photoelectric conversion element is formed over the switching element may be provided.

Further, in the present embodiment, although a scintillator material such as CsI is directly laminated over the passivation layer 23, the scintillator layer such as CsI may be provided on a carbon plate and a film so as to be adhered to the radiation imaging sensor panel by the adhesive layer.

Further, in the above-described first and second embodiments, when the contact hole is used in common, the common electrodes need not necessarily be used (this holds true as well for the third to fifth embodiments to be described later). This is because even when one of the source or drain electrode of the transfer switch 2 and one of the source or drain electrode of the reset switch 3 are not a common electrode, if the end portions of the source or drain electrodes of the transfer switch 2 and the reset switch 3 are formed within the contact hole, a common connection can be made.

Third Embodiment

Figure 5:
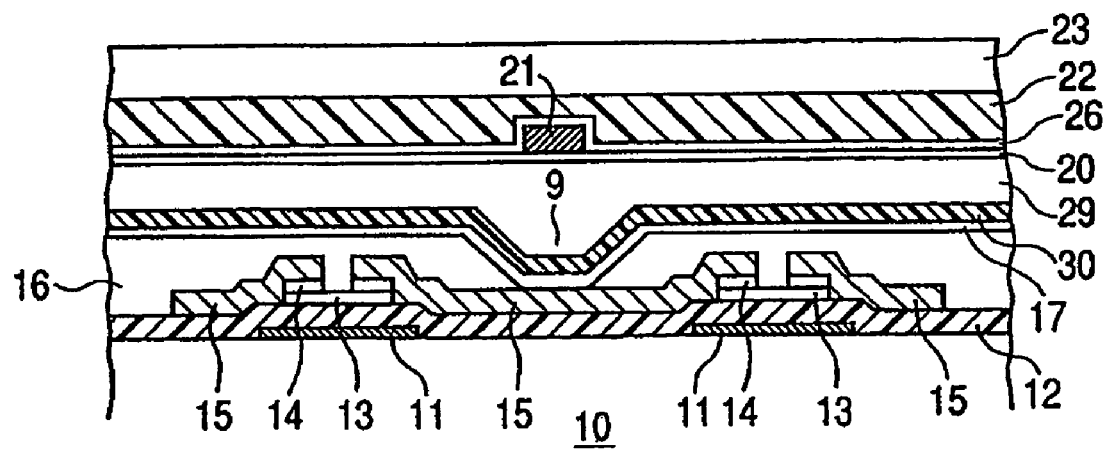
FIG. 5 is a sectional view to explain the radiation imaging apparatus which is a third embodiment of the present invention.

Hereinafter, a radiation imaging apparatus according to a third embodiment will be described with reference to the drawings. FIG. 5 is a sectional view of the radiation imaging apparatus of the present embodiment, and is a sectional view equivalent to the line 2-2 in FIG. 1. The same component parts as those of FIG. 2 are identified using the same reference number, and description thereof will be omitted.

The present embodiment relates to a direct-type radiation imaging apparatus using a conversion element that sandwiches a semiconductor layer such as amorphous selenium directly converting corpuscular rays such as X-rays, γ-rays or α-rays and β-rays into light, e.g., visible light, between electrodes in place of the photoelectric conversion element of FIG. 2 showing the first embodiment. The present embodiment describes the case where X-rays are allowed to enter a radiation detector similarly to the first and second embodiments.

The points of difference between the radiation imaging apparatus of the present embodiment of FIG. 5 and the radiation imaging apparatus of the first embodiment shown in FIG. 2 are as follows. The first point of difference is that the radiation imaging apparatus of the present embodiment shown in FIG. 5 is configured to use the conversion element that directly converts the X-rays into electric charges, and therefore, is not provided with scintillator 25 and adhesive layer 24. The second point of difference is that, since the semiconductor layer such as amorphous selenium that directly converts radiation into electric charges is sandwiched between the electrodes, second insulating layer 18 is replaced by a third impurity semiconductor layer 30.

In the first to third embodiments as describe above, an example has been described, in which, as shown in FIGS. 1 and 3, on an approximately square region in which a transfer switch 2 and a reset switch 3 are formed, the conversion element is disposed such that it is exactly accommodated in that region through an interlayer insulating layer 16. However, the region in which the conversion element (including the conversion element of the direct conversion type of the third embodiment) 1 is disposed does not necessarily need to be disposed over the region in which the transfer switch 2 and the reset switch 3 are formed. That is, the lamination-type radiation imaging apparatus may be such that the conversion element 1, the transfer switch 2, and the reset switch 3 are connected through the contact hole. Further, the conversion element may be of another shape such as a honeycomb shape instead of a square shape. Moreover, although the disposition of the pixels including the conversion element, transfer switch, and reset switch has been shown as a matrix-pattern in FIG. 13, it may be of a two-dimensional pattern, for example, a honeycomb pattern.

Fourth Embodiment

Figure 6:
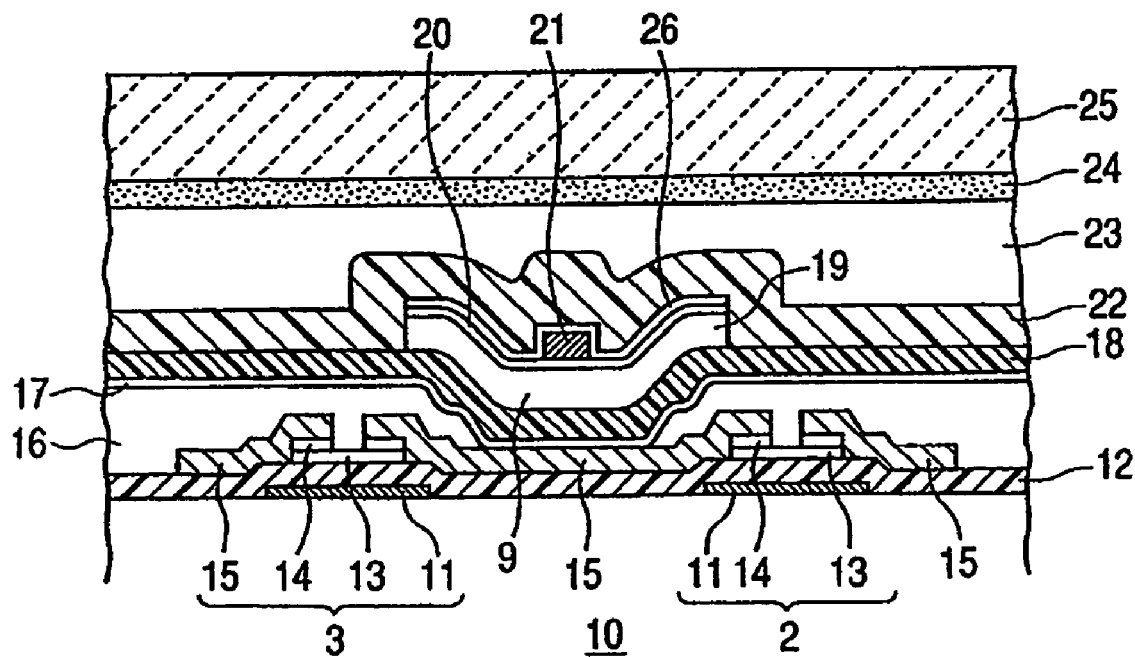
FIG. 6 is a sectional view to explain the radiation imaging apparatus which is a fourth embodiment of the present invention.

Hereinafter, a radiation imaging apparatus according to a fourth embodiment of the present invention will be described by using the drawings. FIG. 6 is a sectional view of the radiation imaging apparatus of the present embodiment. The same component parts as those of FIG. 2 will be identified with the same reference numbers, and description thereof will be omitted.

The first to third embodiments are provided with lamination-type radiation imaging substrates disposed with the MIS-type photoelectric conversion element including the conversion element on the upper portion of the transfer switch and the reset switch. The present embodiment forms the photoelectric conversion element by removing the upper portion of the transfer switch and reset switch. In such configuration, after the photoelectric conversion element has been formed, even when a defect such as a short-circuit between the source and drain electrodes of the transfer switch and reset switch is discovered, a repair of removing the defective portion by laser can be performed.

Fifth Embodiment

Next, a fifth embodiment of the present invention will be described by comparing with a comparison example in which two contact holes are provided for a transfer switch and a reset switch in one pixel.

Figure 7:
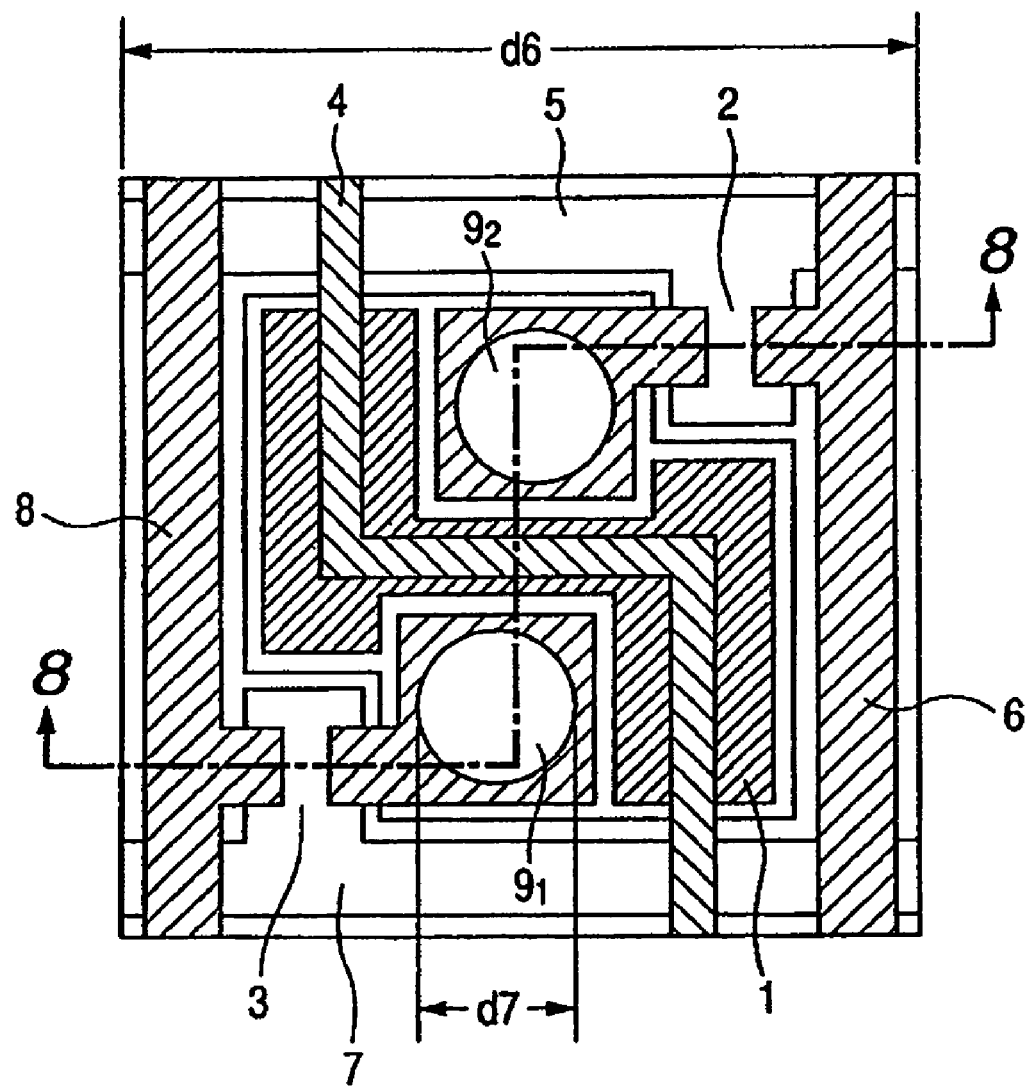
FIG. 7 is a top plan view of the radiation imaging apparatus of a comparison example in the case where a pixel pitch is 50 μm.
Figure 8:
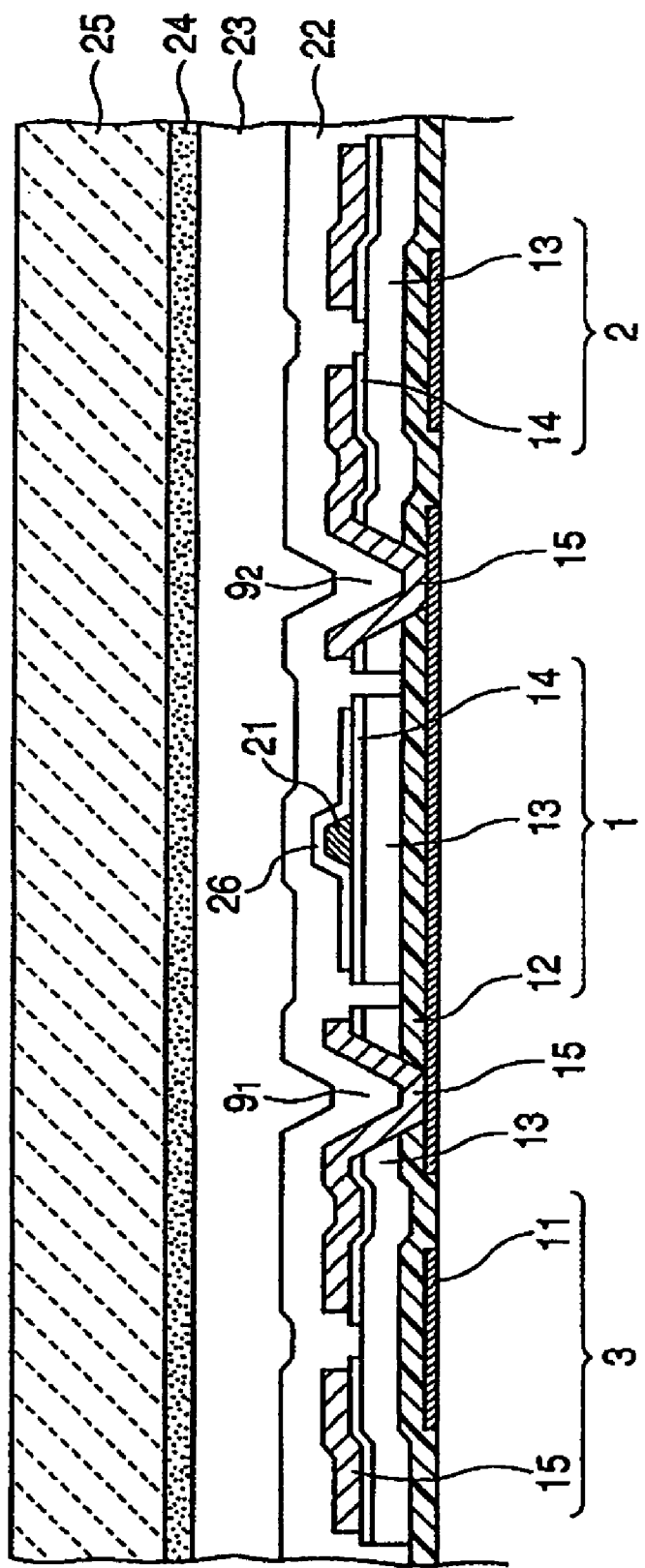
FIG. 8 is a sectional view cut along the line 8-8 in FIG. 7.
Figure 9:
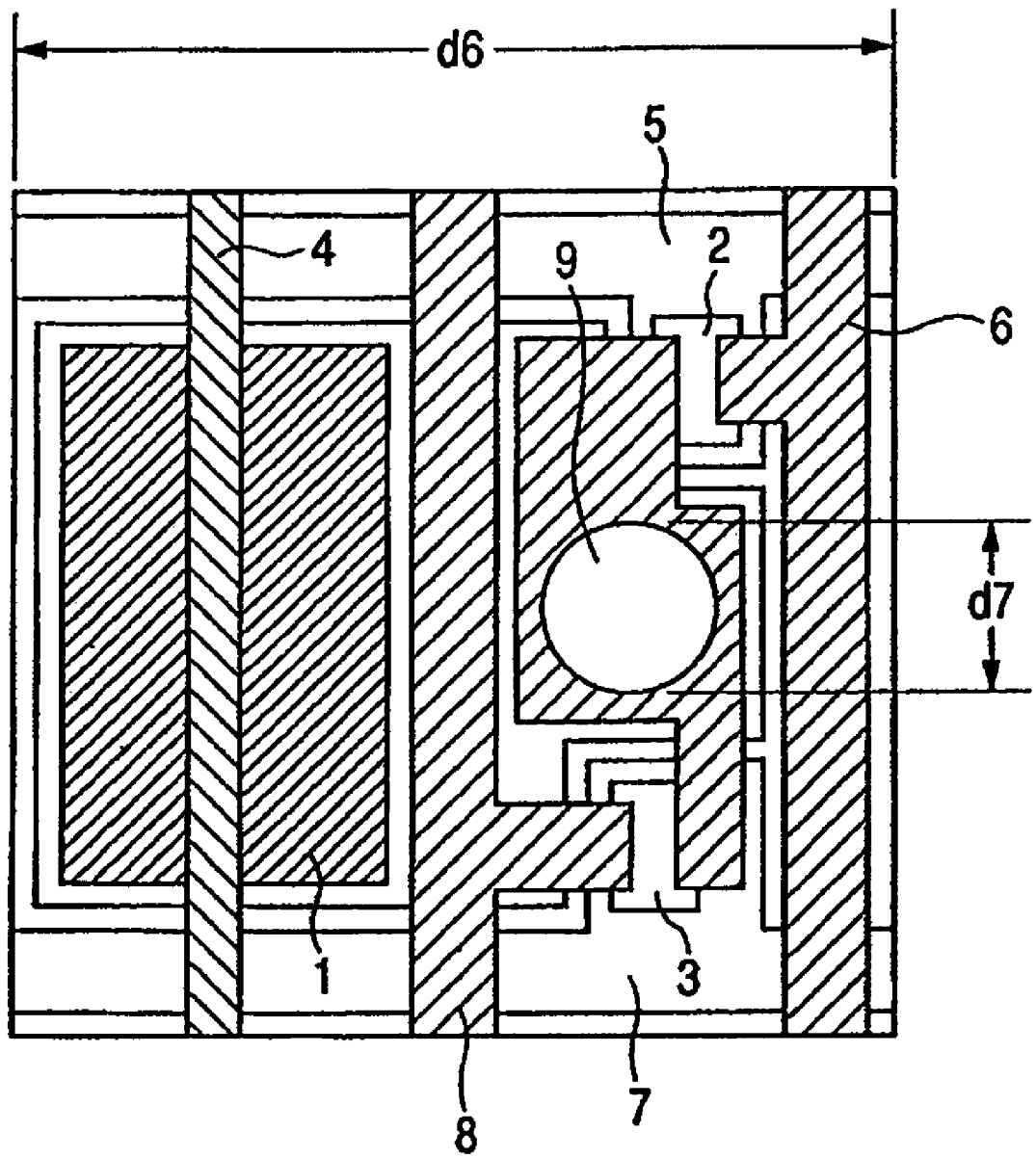
FIG. 9 is a top plan view of a flat type radiation imaging apparatus according to a fifth embodiment of the present invention.

FIG. 7 is a top plan view of a radiation imaging apparatus of the comparison example, in which the pixel pitch is 50 μm, and FIG. 8 is a sectional view cut along the line 8-8 in FIG. 7. FIG. 9 is a top plan view of a flat-type radiation imaging apparatus according to the fifth embodiment of the present invention. The same component parts as those of FIGS. 1 and 2 are indicated with the same reference numbers, and description thereof will be omitted.

As shown in FIG. 8, in the case of the flat type of apparatus, a conversion element 1 which effects photoelectric conversion, a transfer switch (here, transfer TFT) 2, and a reset switch (here, reset TFT) 3 can be simultaneously formed by the same layer. That is, a photoelectric conversion layer of the photoelectric conversion element 1, and channel layers of the transfer switch 2 and the reset switch 3 are formed by the same first semiconductor layer 13. Further, an ohmic contact layer having a hole-blocking effect of the conversion element 1, the transfer switch 2, and the ohmic contact layer of the reset switch 3 are formed by the same first impurity semiconductor layer 14.

Here, since the flat type of apparatus does not have the interlayer insulating film 16, the contact holes 91 and 92 can be formed with a diameter of about 10 μm.

However, as shown in FIG. 7, when the pixel pitch d6 is made 50 μm, the bias wiring 4 often is not connected by the upper and under pixels.

In contrast to this, in the flat-type radiation imaging apparatus of the present embodiment, even when the pixel pitch is 50 μm, as shown in FIG. 9, the ratio of the area occupied by the contact hole 9 within one pixel is reduced, and therefore, the disposition of the bias wiring 4 is made easy. Further, an effect similar to other embodiments can be obtained.

Application Example

Figure 10:
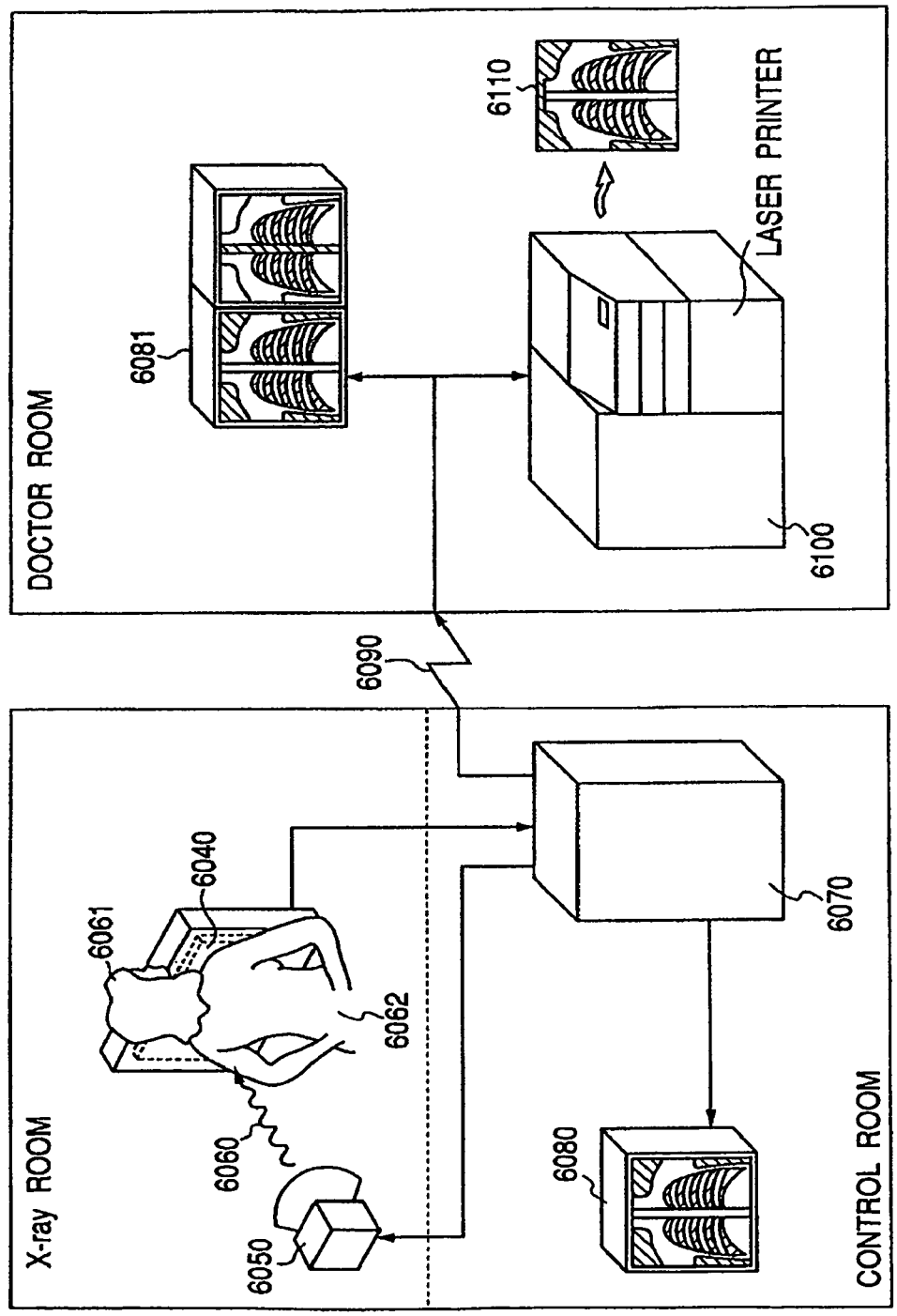
FIG. 10 is a schematic diagram to explain an application example to an X-ray diagnosis system of the radiation imaging apparatus of the present invention.

FIG. 10 shows an example of applying the radiation imaging apparatus according to the present invention to an X-ray diagnosis system.

As shown in FIG. 10, X-rays 6060 generated by an X-ray tube 6050 are transmitted through the chest 6062 of a patient or a test subject 6061, and are incident on a radiation imaging apparatus 6040 that mounts a scintillator (phosphor) on the upper portion. The incident X-rays contain information about the interior of the body of the patient 6061. Corresponding to the incidence of the X-rays, the scintillator emits light, and this is subjected to photoelectric conversion, thereby obtaining electrical information. This information is converted into digital information, and is subjected to image processing by an image processor 6070 which is signal processing means, and can be observed by a display 6080 which is display means of a control chamber.

Further, this information can be transferred to a remote location by transmission processing means such as a telephone line 6090, and can be displayed in the display 6081 which becomes display means installed in a doctor room of another location or can be stored in recording means such as an optical disk, enabling the doctor of the remote location to give a diagnosis. Further, this information can be recorded also in a film 6110 which becomes recording medium by a film processor 6100 which becomes recording means.

As many apparently widely different embodiments of the present invention can be made without departing from the spirit and scope thereof, it is to be understood that the invention is not limited to the specific embodiments thereof except as defined in the claims.

This application claims priority from Japanese Patent Application No. 2006-019032 filed on Jan. 27, 2006, which is hereby incorporated by reference herein.

The invention claimed is:

1. An imaging apparatus, comprising,
an insulating substrate; and
a pixel disposed on said insulating substrate, and comprising:
 a conversion element for converting an optical signal into an electrical signal, said conversion element having a first electroconductive layer, a second electroconductive layer, and a semiconductor layer disposed between and said first electroconductive layer and said second electroconductive layer;
 a signal transfer switch electrically connected to said first electroconductive layer and disposed between said insulating substrate and said first electroconductive layer;
 a reset switch electrically connected to said first electroconductive layer and disposed between said insulating substrate and said first electroconductive layer;
 a bias wiring electrically connected to said second electroconductive layer and disposed over the semiconductor layer; and
 an insulating layer arranged between said first electroconductive layer and said signal transfer switch, and between said first electroconductive layer and said reset switch,
wherein said first electroconductive layer is electrically connected through a common single contact hole formed in said insulating layer to said signal transfer switch and said reset switch, and
wherein said bias wiring is disposed at a position not over said common single contact hole.

2. The imaging apparatus according to claim 1, wherein said signal transfer switch and said reset switch are disposed over said insulating substrate, and
wherein said conversion element is disposed through an insulating layer in the region over said insulating substrate including the region in which said signal transfer switch and said reset switch are disposed.

3. The imaging apparatus according to claim 1, wherein one electrode of said signal transfer switch is electrically connected to said first electroconductive layer, and one electrode of said reset switch is electrically connected to said first electroconductive layer, and
wherein an electroconductive layer, at least a part of which forms said one electrode of said signal transfer switch, and an electroconductive layer, at least a part of which forms said one electrode of said reset switch are formed from a common electroconductive layer.

4. The imaging apparatus according to claim 3, wherein said signal transfer switch and said reset switch are thin film transistors, and said one electrode of said signal transfer switch and said one electrode of said reset switch are the source electrode or drain electrode of said thin film transistor.

5. The imaging apparatus according to claim 1, wherein said signal transfer switch and said reset switch are disposed over said insulating substrate, and
wherein said conversion element is disposed in a region on said insulating substrate excluding at least a part of the region in which said signal transfer switch and said reset switch are formed.

6. The imaging apparatus according to claim 5, wherein said conversion element, said signal transfer switch and said reset switch are formed from the same layer disposed over said insulating substrate.

7. The imaging apparatus according to claim 1, wherein a scintillator that converts radiation into light is disposed over said conversion element.

8. A radiation imaging system, comprising:
the radiation imaging apparatus according to claim 7;
signal processing means that processes the signal from said radiation detector;
recording means for recording the signal from said signal processing means;
display means for displaying the signal from said signal processing means;
transmission processing means for transmitting the signal from said signal processing means; and
a radiation source for generating said radiation.

9. A radiation imaging apparatus, comprising:

an insulating substrate; and a pixel disposed on said insulating substrate and comprising:
- a conversion element for converting radiation into an electrical signal, said conversion element having a first electroconductive layer, a second electroconductive layer, and a semiconductor layer disposed between said first electroconductive layer and said second electrode layer;
- a signal transfer switch electrically connected to said first electroconductive layer and disposed between said insulating substrate and said first electroconductive layer;
- a reset switch electrically connected to said first electroconductive layer and disposed between said insulating substrate and said first electroconductive layer;
- a bias wiring electrically connected to said second electroconductive layer and disposed over the semiconductor layer; and
- an insulating layer arranged between said first electroconductive layer and said signal transfer switch, and between said first electroconductive layer and said reset switch, wherein said first electroconductive layer is electrically connected through a common single contact hole in said insulating layer to said signal transfer switch and said reset switch, and wherein said bias wiring is disposed at a position not over said common single contact hole.

10. The imaging apparatus according to claim 9, wherein said signal transfer switch and said rest switch are disposed over said insulating substrate, and wherein said conversion element is disposed through an insulating layer in the region over said insulating substrate including the region in which said signal transfer switch and said rest switch are disposed.

11. A radiation imaging system, comprising:

the radiation imaging apparatus according to claim 9;

signal processing means that processes the signal from said radiation detector;

recording means for recording the signal from said signal processing means;

display means for displaying the signal from said signal processing means;

transmission processing means for transmitting the signal from said signal processing means; and a radiation source for generating said radiation.

12. The radiation imaging apparatus according to claim 9, wherein one electrode of said signal transfer switch is electrically connected to said first electroconductive layer, and one electrode of said reset switch is electrically connected to said first electroconductive layer, and wherein an electroconductive layer at least a part of which forms said one electrode of said signal transfer switch, and an electroconductive layer at least a part of which forms said one electrode of said reset switch comprise a common electroconductive layer, and an electrical connection between said common electroconductive layer and said conversion element is formed through said common single contact hole.

13. The radiation imaging apparatus according to claim 12, wherein said signal transfer switch and said reset switch are thin film transistors, and said one electrode of said signal transfer switch and said one electrode of said reset switch are the source electrode or drain electrode of said thin film transistor.

14. The imaging apparatus according to claim 9, wherein said signal transfer switch and said reset switch are disposed over said insulating substrate, and wherein said conversion element is disposed in a region over said insulating substrate excluding at least a part of the region in which said signal transfer switch and said reset switch are formed.

15. The imaging apparatus according to claim 14, wherein said conversion element, said signal transfer switch and said reset switch are formed from the same layer disposed over said insulating substrate.

16. A manufacturing method of a radiation imaging apparatus having a pixel, disposed on an insulating substrate, and including a conversion element having a first electroconductive layer, a second electroconductive layer and a semiconductor layer disposed between the first electroconductive layer and the second electroconductive layer, a signal transfer switch a reset switch, a bias wiring electrically connected to the second electroconductive layer and disposed over the semiconductor layer, and an insulating layer arranged between the first electroconductive layer and the signal transfer switch, and between the first electroconductive layer and the reset switch, said manufacturing method comprising the steps of:

forming the transfer switch and the reset switch on the insulating substrate;

forming the insulating layer covering the signal transfer switch and the reset switch;

forming the first electroconductive layer so as to be the first electroconductive layer connected through a common single contact hole to the transfer switch and to the reset switch; and forming the bias wiring at a position not over the common single contact hole.

17. The manufacturing method according to claim 16, wherein the one of source and drain electrodes of the signal transfer switch and the one of source and drain electrodes of the reset switch are formed from a common electroconductive layer.

* * * * *